United States Patent [19]

Yamazaki

[11] Patent Number: 5,075,284
[45] Date of Patent: Dec. 24, 1991

[54] METHOD OF MANUFACTURING SUPERCONDUCTING CERAMICS AND THE PRODUCTS THEREOF

[75] Inventor: Shunpei Yamazaki, Tokyo, Japan

[73] Assignee: Semiconductor Energy Laboratory Co., Ltd., Kanagawa, Japan

[21] Appl. No.: 234,184

[22] Filed: Aug. 19, 1988

[30] Foreign Application Priority Data

Aug. 27, 1987 [JP] Japan .................. 62-214743

[51] Int. Cl.$^5$ .............................................. B32B 9/00
[52] U.S. Cl. .......................................... 505/1; 505/701; 505/702; 505/703; 505/704; 428/413; 428/426; 428/432; 428/424.6; 428/473.5; 428/688; 428/901; 428/930; 428/76
[58] Field of Search ............................. 505/1, 701–704; 428/209, 210, 461, 473.5, 426, 432, 413, 424.6, 688, 901, 930, 76

[56] References Cited

FOREIGN PATENT DOCUMENTS 3915402 11/1989 Fed. Rep. of Germany .
1126284 5/1989 Japan .
1215776 8/1989 Japan .

OTHER PUBLICATIONS

Applied Physics Letters, vol. 52, No. 22, 5-30-88, pp. 1897–1898, Plasma Polymerization for High Tc Oxide Supreconductors, Morohashi et al.
Applied Physics Letters, vol. 51, No. 7; 8/17/87, M. F. Yan et al.: "Water Interaction With the Superconducting $YBA_2Cu_3O_7$ Phase" p. 532, lines 1-39; p. 534; lines 9-14.

Primary Examiner—Patrick J. Ryan
Attorney, Agent, or Firm—Sixbey, Friedman, Leedom & Ferguson

[57] ABSTRACT

A high Tc superconducting ceramics material is produced by mixing ceramic constituents with an alcohol or a freon before firing. The alcohol or fleon functions to reduce the ceramics during firing so that excess oxygen can be eliminated from the superconducting structure. The superconducing ceramics then are coated with an organic resin film in order to avoid the influence of air.

11 Claims, 1 Drawing Sheet

$(YBa_2)Cu_3O_{7-x}$

METHOD OF MANUFACTURING SUPERCONDUCTING CERAMICS AND THE PRODUCTS THEREOF

BACKGROUND OF THE INVENTION

This invention generally relates to the field of superconducting ceramics.

It has long been known that metals such as mercury and lead, intermetallics such as NbNd, $Nb_3Ge$ and NbGa and ternary materials such as $Nb_3(Al_{0.8}Ge_{0.2})$ demonstrates superconductivity. However, the transition temperature of such long known conventional superconducting materials cannot exceed 25° K.

In more recent years, superconducting ceramics have attracted widespread interest. A new material was first reported by researchers at the Zurich laboratory of IBM Corp. as Ba-La-Cu-O-type high temperature superconducting oxides. Subsequently, La-Sr-Cu(II)-O-type superconducting oxides were also proposed. Another type of superconducting material that has been found is $(YBa_2)Cu_3O_{6-8}$. By virtue of the fact that these superconducting ceramics form a quasi-molecular atomic unit in a crystalline structure whose unit cell is constructed with one layer in which electrons have essentially one-dimensional motion, whereas three dimensional electron condition occurs in the long known materials mentioned above, higher transition temperatures were achieved.

Much work has been undertaken by researchers in the field who have endeavored to elevate Tco, the temperature at which resistance vanishes, above the levels previously obtained and preferably above the boiling point of nitrogen (77° K.) or even higher. As described in our European Patent Application No. 87309081.5, we have investigated superconducting ceramic materials having the stoichiometric formulae $(A_{1-x}B_x)_yCu_zO_w$, where A represents one or more elements of Group IIIa of the Periodic Table, e.g., the rare earth elements, and B represents one or more elements of Group IIa of the Periodic Table, e.g. the alkaline earth elements including beryillium and magnesium, and in the continuation of these investigations we have disclosed that the contact of the external surface of superconductors with air makes it difficult to obtain a stabilized high Tco.

OBJECTS AND SUMMARY OF THE INVENTION

It is therefore an object of the invention to provide superconducting ceramics having a higher transition temperature than hitherto and to manufacture superconducting ceramics having stabilized transition temperatures.

Whereas in previous attempts to find superconducting materials having commercial availabilities, attention has been focussed upon the elevation of Tc by modifying the composition or molar ratios of the constituent elements, in accordance with the present invention there is principally provided an improved process for the manufacture of superconducting ceramics in accordance with which, immediately after the formation of superconducting structure, the superconducting body is coated with a protecting film an organic resin film in order not to collect water from surrounding atmosphere, particularly from air during cooling of the superconducting body to the liquid nitrogen temperature for transition to superconducting phase. Water involved makes superconducting property of the superconducting ceramics degraded.

In a prefered embodiment, starting chemcials for constituting superconducting ceramics are ground, compressed and fired into a bulk. After repeating this procedure one or more times for making uniform composition, the fine powder is mixed with a liquid comprising no water, followed by compressing into a compact containing the liquid therein. The compact is gradually heated so as not to cause flash reduction action, and fired at 500°–1400° C. The compact is then coated with an organic resin film immediately after taking out from the oven. Examples of such organic resins are epoxy resins, fluorine resins and polyimide resins. In accordance with experimental, the critical temperature was elevated to 150°–400° K.

Superconducting materials in accordance with the present invention have the modified perovskite-like triple-layered structure as shown in the figure. Each layer of the structure is constructed mainly by a Copper atoms 2 and Oxygen atoms 5 located around the copper atoms 2. Oxygen vacancies 7 are considered to play an important role in superconduction. In order to eliminate excess oxygen from superconducting ceramics, a reducing liquid comprising no water is introduced into the ceramics before firing. Examples of such reducing liquids are methyl alcohol, ethyl alcohol and freons such as freon 113. The reducing liquids react with oxygen contained in ceramic materials and produce water vapor and carbon dioxide.

Because of the elimination of oxygen by virtue of a reducing liquid involved throughout the inside of the ceramics, the atomic distance along C axis can be reduced and therefore very high critical temperatures can be obtained.

Other feature of the invention are set forth with particularity in the appended claims and will become clear to those possessed of the relevant skills form consideration of the following description of exemplary embodiments.

DETAILED DESCRIPTION OF THE PREFERRED EMBODIMENT

Figure 1:
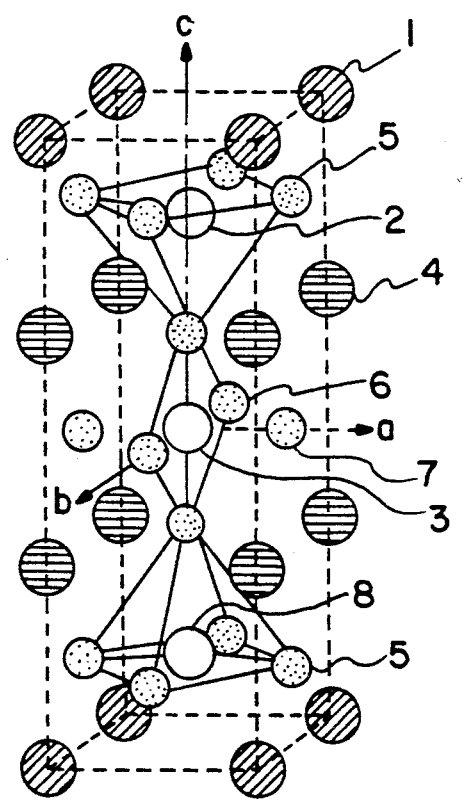
FIG. 1 is a diagram showing a modified perovskite-like structure of superconducting ceramics in accordance with the present invention.
Figure 1:
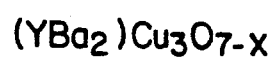

Described hereinafter are a couple of examples illustrating the manufacture superconducting ceramics conforming to the stoichiometric formulae $(A_{1-x}B_x)_yCu_zO_w$, where A is one or more elements of Group IIIa of the Periodic Table, e.g., the rare earth elements, B is one or more elements of Group IIa of the Periodic Table, e.g., the alkaline earth metals including beryllium and magnesium, and x=0-1; y=2.0-4.0, preferably 2.5-3.5; z=1.0-4.0, preferably 1.5-3.5; and w=4.0-10.0, preferably 6.0-8.0, e.g. $YBa_2Cu_3O_{7-x}$ $YCa_2Cu_3O_{7-x}$.

EXAMPLE 1

Prescribed amounts of $BaCO_3$, $CaCO_3$, CuO and $Y_2O_3$ (High Purity Chemical Industries Co. Ltd. 99.95% or higher) were used for preparing a superconducting ceramic material of the above formula where x=0.67, y=3, z=3 and w=6-8, i.e., in consistence with $(YBa_2)$-$Cu_3O_{6-8}$ or $(YBaCa)Cu_3O_{6-8}$. The factor "w" was controlled by adjusting the sintering condition.

After being mixed in a ball mill, the high purity chemicals were pressed in a capsule at 500 Kg/cm and formed into a cylindrical shaped tablet of 10 mm diameter and 3 mm height. The tablet was heated (fired) and oxidized at 500°–1100° C., e.g., 950° C. for 8 hours in an oxidizing atmosphere such as in air, this step being called pre-firing hereinafter. Next, the tablet was finely ground in a ball mill so that average grain diameter was 20–0.003 microns, e.g., 0.5 micron or smaller. This step is repeated 3–5 times. In this step, it is desired to take care of avoiding occurance of $Y_2BaCuO_5$ or copper oxide phase in the product.

Then, the powder of 20–0.003 microns average diameter was sufficiently mixed with methyl alcohol in a ball mill, and was pressed in a capsule at a pressure of 1 t/cm$^2$ to be formed into a tablet form.

The tablets were then fired, hereinafter called main-firing, for 10–50 hours at 500°–1400° C., for example 15 hours at 930° C. in an oxidizing atmosphere such as in air. This firing was carried out by elevating the temperature from room temperature to the prescribed temperature at 10°–1000° C. per hour, e.g. at 100° C. per hour. While the temperature was being elevated, the ceramic material was partially reduced by virtue of the alcohol. Thereafter, the temperature was descended to 400° C. at 100° C. per minute.

Then, a peroveskite-like structure was constituted in a dense structure. Next, the tablet was covered with a resin coating by immersion in a silicone resin solution followed by thermal setting at 150° C. for two hours or 30 minutes in a dehumidified air. In case of coating of an epoxy resin, thermal setting is carried out at 150° C. for 30 minutes or 240° C. for 5 minutes in air.

With this ceramic material, the relation between the temperature and the resistivity thereof was investigated. When the temperature was descended from 250 K., the resistivity initiated to drop around 25 K. and disappeared at 248 K. This critical temperature 248 K. was repeatedly observed when the temperature was repeatedly descended and elevated between room temperature and the critical temperature. For reference, a same superconducting ceramic material was fabricated and examined. As a result, the critical temperature dropped to 93 K. when descent and elevation of the temperature was repeated.

The organic resin covering superconducting materials is preferably selected from soft resins, because local stress in supercoducting materials caused by contraction or expansion of the resin during curing is undesirable.

EXAMPLE 2

The procedure of Example 1 was repeated but with 50% of Y substituted by Yb and Ca substituted by Sr, and with a freon in place of methyl alcohol. The Y and Yb were introduced as oxides or fluorides. As a result, Tc onset was measured to be 300° K. and Tco was 297° K., which were maintained for a week or long term.

The foregoing Examples are merely illustrative of the invention, and do not include all of the combinations of elements and process variations which may be used to produce superconducting ceramic material in accordance with the invention, other combinations also being effective to provide improved superconducting materials.

Superconducting ceramics for use in accordance with the present invention also may be prepared consistent with the stoichiometric formulae $(A_{1-x}B_x)_yCu_zO_wX_v$ where A is one or more elements of Group IIIa of the Periodic Table, e.g., the rare earth elements, B is one or more elements of Group IIa of the Periodic Table, e.g., the alkaline earth metals including beryllium and magnesium, X is one or more elements of a group consisting of Ge, Sn, Pb, F or Cl, and x=0–1; y=2.0–4.0, preferably 2.5–3.5; z=1.0–4.0, preferably 1.5–3.5; w=4.0–10.0, preferably 6.0–8.0; and v=0–3, e.g. $YBa_2Cu_3O_{6-8}$. Also, superconducting ceramics for use in accordance with the present invention may be prepared consistent with the stoichiometric formulae $(A_{1-x}B_x)_yCu_zO_w$, where A is one or more elements of Group Vb of the Periodic Table such as Bi, Sb and As, B is one or more elements of Group IIa of the Periodic Table, e.g., the alkaline earth metals and x=0.3–1; y=2.0–4.0, preferably 2.5–3.5; z=1.0–4.0, preferably 1.5 –3.5; and w=4.0–10.0, preferably 6.0–8.0, e.g. $BiCaSrCu_3O_{6-8}$.

While for several embodiments have been specifically described, it is to be appreciated that the present invention is not limited to the particular examples described and that modifications and variations can be made without departure from the scope of the invention as defined by the appended claims. For example, diamond-like carbon can be used for protecting the surface of superconducting ceramic films. The formation process of carbon materials can be seen in Chinese Patent Application No. 88101061.8 filed on Feb. 24, 1988. Also, magnetic field application during main-firing is effective for aligning crystalline axes. In this description, Group IIIa is directed to a group consisting of transition elements as shown in "Physics and Chemistry Dictionary" published by Iwanami, Japan. In this connection, Group IIIa consists of typical elements in "The Penguin Dictionary of Science" published by Penguin Books.

I claim:

1. A ceramic superconductor comprising:
   a compacted superconducting ceramic material conforming to the stoichiometric formula of $(A_{1-x}B_x)_yCu_zO_w$, where A is one or more elements selected from among Group IIIa of the Periodic Table, B is one or more elements of Group IIa of the Periodic Table, and $0<x<1$; y=2.0–4.0; z=1.0–4.0; and w=4.0–10.0; and
   a coating covering the exposed surface of said superconducting ceramic material, said coating selected from the group consisting of DLC or organic resin.

2. The ceramic superconductor of claim 1 wherein said superconducting ceramic material is $YBa_2Cu_3O_{7-x}$ or $YCa_2Cu_3O_{7-x}$.

3. The ceramic superconductor of claim 1 wherein said organic resin is selected from the group consisting of epoxy resin, fluorine resin, and polyimide resin.

4. A ceramic superconductor comprising:
   a compacted superconducting ceramic material conforming to the stoichiometric formula of $(A_{1-x}B_x)_yCu_zO_wX_v$, where A is one or more elements of Group IIIa of the Periodic Table, B is one or more elements of Group IIa of the Periodic Table, X is one or more elements of a group consisting of Ge, Sn, Pb, F, or Cl, and $0<x<1$; y=2.0–4.0; z=1.0–4.0; w=4.0–10.0; and v=0–3; and
   a coating covering the exposed surface of said superconducting ceramic material, said coating selected from the group consisting of DLC or organic resin.

5. The ceramic superconductor of claim 4 wherein said organic resin is selected from the group consisting of epoxy resin, fluorine resin, and polyimide resin.

6. A ceramic superconductor comprising:

a compacted superconducting ceramic material conforming to the stoichiometric formulae of $(A_{1-x}B_x)_y Cu_z O_w$, where A is one or more elements of Group Vb of the Periodic Table, B is one or more elements of Group IIa of the Periodic Table, and $0.3 \leq x < 1$; $y = 2.0-4.0$; $z = 1.0-4.0$; and $w = 4.0-10.0$; and a coating covering the exposed surface of said superconducting ceramic material, said coating selected from the group consisting of DLC or organic resin.

7. The ceramic superconductor of claim 6 wherein said superconducting ceramic material is $BiCaSrCu_3O_{6-8}$.

8. The ceramic superconductor of claim 7 wherein said organic resin is selected from the group consisting of epoxy resin, fluorine resin, and polyimide resin.

9. A ceramic superconductor comprising:
a compacted superconducting ceramic material; and
a coating covering the exposed surface of said superconducting ceramic material, said coating selected from the group consisting of DLC or organic resin.

10. The ceramic superconductor of claim 9 wherein the superconducting ceramic material comprises copper.

11. The ceramic superconductor of claim 9 wherein said organic resin is selected from the group consisting of epoxy resin, fluorine resin, and polyimide resin.

* * * * *